US012595550B2

(12) United States Patent
Weichart

(10) Patent No.: US 12,595,550 B2
(45) Date of Patent: Apr. 7, 2026

(54) VACUUM LAYER DEPOSITION APPARATUS AND METHOD OF DEPOSITING A LAYER ON A SUBSTRATE, ESPECIALLY ON A SUBSTRATE COMPRISING INDENTATIONS IN THE SURFACE TO BE COATED

(71) Applicant: EVATEC AG, Trübbach (CH)

(72) Inventor: Jürgen Weichart, Balzers (LI)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 18/838,890

(22) PCT Filed: Jan. 18, 2023

(86) PCT No.: PCT/EP2023/051148
§ 371 (c)(1),
(2) Date: Aug. 15, 2024

(87) PCT Pub. No.: WO2023/156117
PCT Pub. Date: Aug. 24, 2023

(65) Prior Publication Data
US 2025/0188594 A1      Jun. 12, 2025

(30) Foreign Application Priority Data

Feb. 18, 2022    (CH) ............................... 000162/2022

(51) Int. Cl.
*H01J 37/34* (2006.01)
*C23C 14/35* (2006.01)
(Continued)

(52) U.S. Cl.
CPC .............. *C23C 14/35* (2013.01); *C23C 14/50* (2013.01); *C23C 14/54* (2013.01);
(Continued)

(58) Field of Classification Search
None
See application file for complete search history.

(56) References Cited

U.S. PATENT DOCUMENTS 3,661,761 A     5/1972   Koenig
5,795,452 A  *  8/1998   Kinoshita ........... H01J 37/3405
156/345.46

(Continued)

FOREIGN PATENT DOCUMENTS

DE          2026321 A1    12/1970
EP          0350940 A2     1/1990
(Continued)

OTHER PUBLICATIONS

Helmersson, U., et al., "Ionized physical vapor deposition (IPVD): A review of technology and applications", Thin Solid Films 513 (2006) 1-24: DOI:10.1016/J.TSF.2006.03.033.
(Continued)

*Primary Examiner* — Jason Berman
(74) *Attorney, Agent, or Firm* — McDonald Hopkins LLC

(57) ABSTRACT

A vacuum layer deposition apparatus includes a vacuum coating chamber with an inner space; a material source to generate electrically positively charged particles of a material to be deposited on a substrate in said inner space; a substrate holder with an extended metal or dielectric material surface exposed to said inner space; and a Rf plasma source comprising: first and second electrodes Rf-connectable or Rf-connected to first and second taps of a Rf generator, respectively. Said first and second electrodes include first and second electrode surfaces, respectively, of metal or of a dielectric material which are freely exposed to said inner space. Said extended surface of said substrate holder is at least a part of said first electrode surface and said second electrode surface is larger than said first electrode (Continued)

Figure 1:
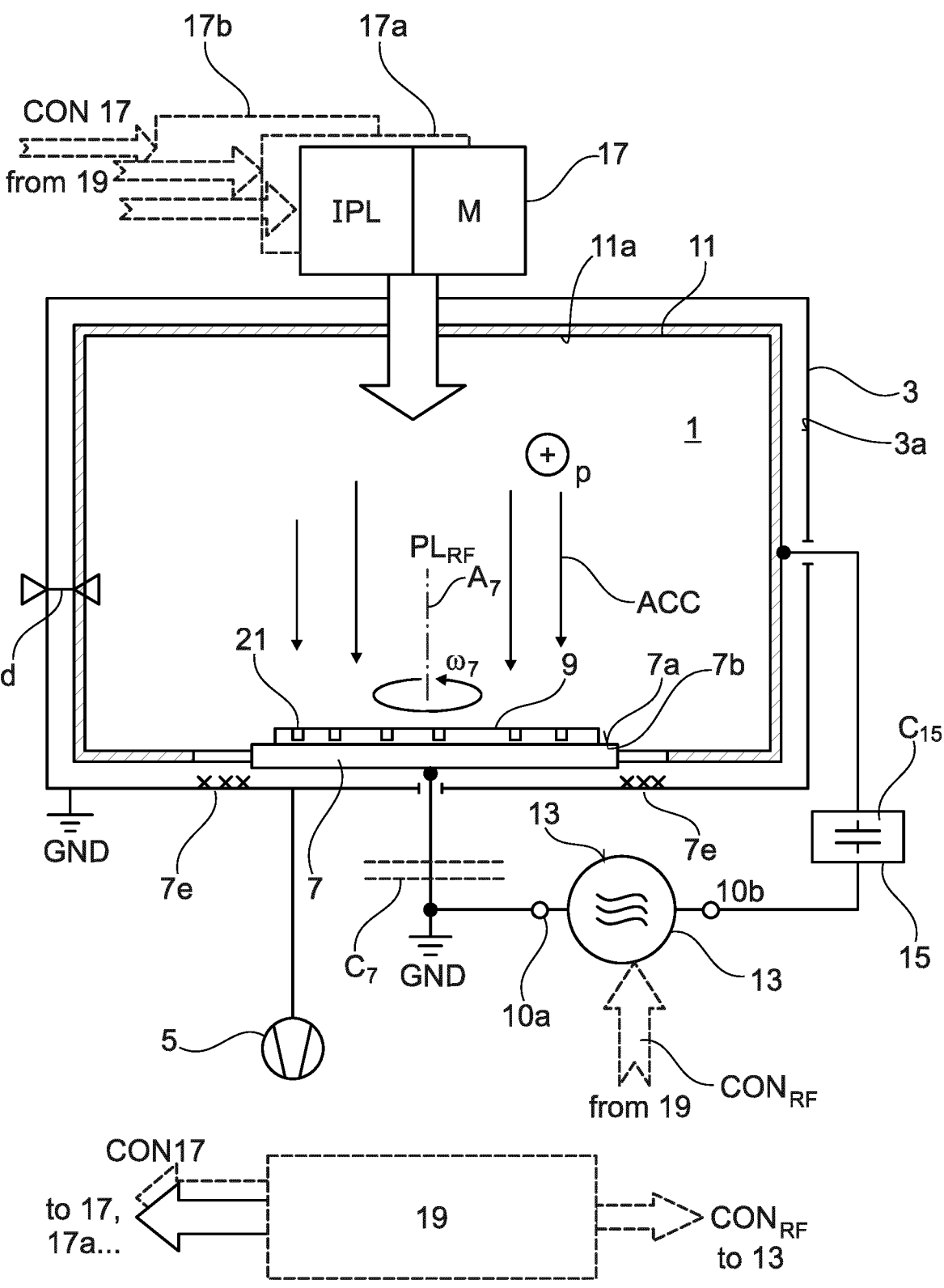

surface by at least a factor of 1.5. A method includes vacuum-process depositing a layer on a substrate.

35 Claims, 11 Drawing Sheets

(51) Int. Cl.
*C23C 14/50* (2006.01)
*C23C 14/54* (2006.01)
*H01J 37/32* (2006.01)

(52) U.S. Cl.
CPC .. *H01J 37/32174* (2013.01); *H01J 37/32568* (2013.01); *H01J 37/32587* (2013.01); *H01J 37/3405* (2013.01); *H01J 37/3467* (2013.01); *H01J 2237/332* (2013.01)

(56) References Cited

U.S. PATENT DOCUMENTS

| | | | |
|---|---|---|---|
| 6,248,219 | B1 | 6/2001 | Wellerdieck et al. |
| 6,413,382 | B1 | 7/2002 | Wang et al. |
| 7,381,657 | B2 | 6/2008 | Zhang et al. |
| 7,544,276 | B2 | 6/2009 | Zhang et al. |
| 8,475,634 | B2 | 7/2013 | Weichart et al. |
| 9,355,824 | B2 | 5/2016 | Kadlec et al. |
| 10,692,707 | B2 | 6/2020 | Weichart et al. |
| 2008/0179297 | A1* | 7/2008 | Bailey ............... H01J 37/32568 |
| | | | 219/69.15 |
| 2009/0114244 | A1* | 5/2009 | Sexton ............. H01J 37/32091 |
| | | | 134/1.1 |
| 2010/0080933 | A1* | 4/2010 | Kudela ............... C23C 16/5096 |
| | | | 427/574 |
| 2022/0042168 | A1 | 2/2022 | Abraham |
| 2022/0108871 | A1* | 4/2022 | Yamazawa ........ H01J 37/32174 |

FOREIGN PATENT DOCUMENTS

| | | |
|---|---|---|
| EP | 0451587 A2 | 10/1991 |
| EP | 0495524 A1 | 7/1992 |
| EP | 2382648 B1 | 10/2016 |
| WO | 2017/071831 A1 | 5/2017 |
| WO | 2020/126910 A1 | 6/2020 |

OTHER PUBLICATIONS

Inaba, H., et al., "Development of CH4-Radio-Frequency-Plasma-Enhanced Chemical Vapor Deposition Method with a Positively Self-Biased Electrode for Diamond-Like Carbon Film", Japanese Journal of Applied Physics, vol. 36, No. 5R (1997) pp. 2817-2821; DOI: 10.1143/jjap.36.2817.
International Search Report and Written Opinion of International Application No. PCT/EP2023/051148, dated Apr. 21, 2023, 18 pages.

* cited by examiner

1

VACUUM LAYER DEPOSITION APPARATUS AND METHOD OF DEPOSITING A LAYER ON A SUBSTRATE, ESPECIALLY ON A SUBSTRATE COMPRISING INDENTATIONS IN THE SURFACE TO BE COATED

Vacuum-process coating substrates which comprise, in the surface to be coated, indentations, e.g. pinholes, vias, trenches, is a demanding task. Several approaches are reported, e.g., in the U.S. Pat. No. 7,381,657B2 or in the U.S. Pat. No. 7,544,276B2 by sputter deposition making use of RF bias to the substrate holder and supplying the target electrode of the sputtering source with pulsed DC power. Also, HIPIMS-sputtering, also called HPPMS-sputtering, has been reported for the addressed purpose, i.e., to make use of pulsed DC sputtering run at very high peak currents and with very low duty cycles, the ratio of pulse-on-time to pulse repetition period. HIPIMS is described e.g., in U.S. Pat. Nos. 9,355,824, 8,475,634, 10,692,707 B2.

Definitions:

When we address HIPIMS applied between two electrodes, throughout the present description and claims, we understand pulsed DC wherein the duty cycle (time extent of one pulse to time extent of respective pulse repetition period) is 0.01 to 0.1. Thereby the pulses repeatedly applied with a duty cycle as indicated may be replaced by respective packets of multiple pulses.

We understand under Rf a frequency in the range of 1 to 90 MHz, e.g., of 13.56 MHz.

It is an object of the present invention to propose an alternative approach of vacuum-process coating substrates, especially of substrates with indentations, as e.g., pinholes, vias, trenches in the surface to be coated, the walls of such indentations having to be coated as well, up to filling such indentations without hollow spaces left and encapsuled therein.

This object is resolved by a vacuum layer deposition apparatus according to the invention comprising:

A vacuum coating chamber with an inner space;

A material source constructed to generate electrically positively charged particles of a material to be deposited on a substrate and in the inner space of the vacuum coating chamber;

The apparatus further comprises:

A substrate holder with an extended metal or dielectric material surface exposed to said inner space;

a Rf plasma source which comprises:

a first electrode electrically operationally Rf-connectable or electrically operationally Rf-connected to a first tap of a Rf generator;

a second electrode electrically operationally Rf-connectable or electrically operationally Rf-connected to a second tap of the Rf-generator.

Definition:

By the terms "electrically operationally Rf-connectable or electrically operationally Rf-connected" we understand electrically connectable or—connected directly or indirectly, so that an electric Rf signal of that characteristic, e.g., of that frequency, as generated by the Rf generator, may pass. Thus, such electrical operational Rf-connection may be for both, DC signals and Rf signals, or just for Rf signals, DC signals being blocked.

The first electrode as addressed comprises a first electrode surface of metal or of a dielectric material. This first electrode surface is that part of the overall surface of the first electrode which is freely exposed to the inner space.

The second electrode comprises a second electrode surface of metal or of a dielectric material. This second electrode surface is that part of the overall surface of the second electrode which is freely exposed to the inner space.

Thereby the extended surface of the substrate holder is a part of the first electrode surface and the second electrode surface is larger than the first electrode surface by a factor of at least 1.5.

From the vacuum etching art, it is known to provide a substrate to be etched on a smaller electrode surface, opposite a larger electrode surface, and to operationally connect an Rf generator to these electrode surfaces. Between the addressed electrode surfaces a Rf plasma discharge is generated. The drop of electric potential from the plasma potential to the smaller electrode surface is larger than the drop of electric potential from the plasma potential to the larger electrode surface. This phenomenon is known according to the law of Koenig and as described e.g., in the U.S. Pat. No. 6,248,219 of Wellerdieck. The larger drop of electric potential leads to increased directional acceleration of positive etching ions, normally Ar ions, towards the smaller electrode surface. Thus, a substrate deposited on the smaller electrode surface becomes predominantly etched, whereas the larger electrode surface is predominantly coated with the material which is etched off the smaller electrode.

By the fact, that according to the present invention, the extended metal or dielectric material surface of the substrate holder is part of the smaller first electrode surface with respect to the second electrode surface, both respectively operationally connected or operationally connectable to the taps of the Rf generator so as to generate therebetween a Rf plasma, the directionally accelerating phenomenon of positively charged particles towards the smaller first electrode surface and thus towards a substrate on the substrate holder, is inventively exploited to perform such directional acceleration of positively charged particles of that material which is to be deposited on the substrate.

This directional acceleration of positively charged particles of that material which is to be deposited on the substrate leads to coating of indentations in the surface of the substrate as well.

Thus, a technique well known for etching purposes turns out to be highly suited for coating purposes, especially of indentations.

In one embodiment the first electrode and thus the substrate holder as well as the vacuum coating chamber are connected to the ground potential of the vacuum coating apparatus, which has the advantage that the substrate transport and/or the substrate-exchange by or on the substrate holder is performed on that ground potential, thus avoiding arcing issues and perturbations of the electric field. The substrate holder may thereby be part of or may be served by a substrate transport mechanism, transporting substrates into and out of the vacuum coating chamber apparatus, via unidirectionally or bidirectionally served load locks directly provided at the vacuum coating chamber and/or via unidirectionally or bidirectionally served load-locks provided at remote ambient-to-vacuum interfaces.

Thus, in one embodiment of the apparatus according to the invention comprises a transport mechanism for the substrate holder adapted to transport the substrate holder into and from a position in which a substrate on said substrate holder is in coating position.

One embodiment of the apparatus according to the invention comprises a robot adapted to load and respectively unload a substrate on and respectively from the extended surface of the substrate holder.

In one embodiment of the apparatus according to the invention, at least a part of the second electrode extends opposite and facing the substrate holder.

In one embodiment of the apparatus according to the invention the material source which is constructed to generate the electrically positively charged particles comprises a source of material and a further plasma source which is constructed to ionize material delivered from said source of material.

The further plasma source is provided in this embodiment, because in some applications of the apparatus, the Rf plasma, which is generated between the first and second electrode surfaces, does not sufficiently ionize the material delivered by the source of material and thus to generate a desired density of electrically positively charged particles of that material delivered by the source of material into the inner space of the vacuum coating chamber.

In spite of the fact that the addressed further plasma source may be one of different known types of plasma sources e.g., may be a microwave plasma source, according to one embodiment of the apparatus according to the invention, the further plasma source comprises a third electrode and a fourth electrode respectively electrically operatively connected or respectively electrically connectable to taps of a further generator and exposed to the inner space of the vacuum coating chamber.

By the fact, that one of the third and of the fourth electrodes is common with the second electrode, the surface of that one electrode, which is freely exposed to the inner space of the vacuum coating chamber, is exploited to largen the second electrode surface.

In one embodiment of the apparatus according to the invention, one of the third and of the fourth electrodes, as were addressed, is located electrically isolated from and around the substrate holder.

Thereby the further plasma is spread all along the reaction space adjacent to the substrate, and, with respective electrical polarity applied to that one electrode, electrons may be drawn from the substrate to be coated.

In one embodiment of the apparatus according to the invention, the further generator, as was addressed, is a DC or a pulsed DC generator, in one embodiment a HIPIMS generator.

The plasma generated by these types of further generators is most apt to generate a high density of electrically positively charged particles of the material to be deposited on the substrate and delivered by the source of material.

In one embodiment of the apparatus according to the invention the material source, which is constructed to generate the electrically positively charged particles, comprises a source of material which source comprises at least one gas feed line discharging gaseous material into the inner space, and which is in flow connection with a gas tank containing a gas, particularly a reactive gas.

In one embodiment of the apparatus according to the invention the material source, which is constructed to generate the electrically positively charged particles, comprises at least one source delivering material from a solid or from a liquid.

Thus, the material deposited on the substrate is based on a gaseous material which becomes reacted and electrically positively charged by the effect of the Rf plasma and/or of a further plasma provided, as e.g. in a PECVD deposition process or is based on a solid material, which as well becomes electrically positively charged by the effect of the Rf plasma and/or of the further plasma as provided as e.g. in a cathode sputter deposition process or in a deposition process by thermal- or electron-beam-evaporation. In the cathode sputtering deposition process the further plasma is the plasma generated by the cathode sputtering process. Please note, that the material delivered by the material source may origin from a solid or from a liquid. E.g. cathode sputtering may be done from a solid material target, but, for some materials also from a liquid material target, as e.g. for Ga, In, Hg.

Combing these two approaches is performed in respective reactive processes, where solid material is reacted with a reactive gas, as for reactive cathode sputtering, reactive thermal- or electron-beam-evaporation.

In one embodiment of the apparatus according to the invention the at least one source delivering solid material is a cathode sputter source and a target of the cathode sputter source is one electrode of a further plasma source.

Thus, the cathode sputter source generates, one hand, the solid material to be deposited and, on the other hand, the plasma of the cathode sputter source provides for ionizing the sputtered off material.

In one embodiment of the apparatus according to the invention, the cathode sputter source is a magnetron sputter source.

In one embodiment of the apparatus according to the invention, the magnetron sputter source is a planar magnetron sputter source or a magnetron sputter source with a cylindrical solid material target which is drivingly rotatable around the axis of the cylindrical target.

One embodiment of the apparatus according to the invention comprises a source controller operatively connected to control inputs of the Rf-generator and constructed to control at least one of ON/OFF-timing of the Rf generator and of output power of the Rf generator.

In one embodiment of the apparatus according to the invention the material source, which is constructed to generate the electrically positively charged particles, comprises a source of material and a further plasma source which latter is constructed to ionize material delivered from the source of material and which is operatively connected to an electrical supply source. This embodiment further comprises a source controller, which is operatively connected to control inputs of the electrical supply source, and which is constructed to control at least one of ON/OFF-timing of the electrical supply source and of the output power of the electrical supply source.

One embodiment of the apparatus according to the invention comprises more than one of the material sources, and the source controller is operatively connected to more than one of the material sources and is constructed to control mutual ON/OFF-timing of the more than one material sources.

Thus, in one embodiment of the apparatus according to the invention one or more than one of the following features are provided:

the embodiment comprises more than one of the material sources, which are respectively constructed to generate respective electrically positively charged particles, and a source controller, which is operatively connected, respectively, to more than one of the material sources and is constructed to control mutual ON/OFF-timing of the respective more than one material sources and/or the rate of electrically positively charged particles output by the respective material sources;

at least some of the more than one material sources, comprise, respectively, a source of material and a further plasma source, which latter is constructed to ionize material delivered from the respective source of material, which plasma source is operatively connected to an electrical supply source, and comprises a source controller, which is operatively connected to control inputs of the respective electrical supply sources and which is constructed to control at least one of ON/OFF-timing of the respective electrical supply sources and of the output power of the respective electrical supply sources, a source controller is operatively connected to control inputs of the Rf-generator and is constructed to control at least one of ON/OFF timing of the Rf generator and of output power of the Rf generator.

One embodiment of the apparatus according to the invention comprises a transport mechanism constructed to convey a substrate into and out of a coating position in said vacuum coating chamber and wherein said substrate holder is a part of said transport mechanism.

In one embodiment of the apparatus according to the invention the transport mechanism comprises a conveyer drivingly movable along a plane parallel to said extended surface of said substrate conveyer, beneath said coating position, said substrate cooperating with a lift, drivingly lifting said substrate holder from said conveyer in a position in which a substrate on said substrate holder is in the coating position.

One embodiment of the apparatus according to the invention comprises a handling robot loading a substrate on and unloading a substrate from the substrate holder.

In one embodiment of the apparatus according to the invention the substrate holder, at least in a position in which a substrate thereon is in a coating position, is operated on electric ground potential.

Each of the addressed embodiments may be practiced in combination with one or more than one of the other embodiments unless such embodiments are in contradiction.

The object of the present invention is further resolved by a method of vacuum-process depositing a layer on a substrate, especially on a substrate comprising indentations in the surface to be coated, or of manufacturing such substrates coated with a vacuum-process deposited layer, comprising:

providing a substrate on a first electrode surface within an evacuated vacuum recipient;

Generating within the vacuum recipient electrically positively charged particles of a material to be deposited on said substrate;

Directionally accelerating the positively charged particles towards the surface of the substrate by generating a Rf plasma between the first electrode surface and a second electrode surface, which second electrode surface being larger than the first electrode surface by a factor of at least 1.5.

One variant of the methods according to the invention, comprises intermittently enabling and disabling the RF plasma discharge during the deposition process.

One variant of the methods according to the invention, comprises generating positively charged particles of different materials staggered in time during the deposition process.

In one variant of the methods according to the invention generating the positively charged particles comprises generating in the vacuum recipient a further plasma.

One variant of the methods according to the invention comprises exploiting the second electrode surface as one electrode surface for generating the further plasma.

In one variant of the methods according to the invention generating the positively charged particles comprises feeding a gas into the vacuum recipient.

In one variant of the methods according to the invention generating the positively charged particles comprises freeing material from a solid or from a liquid material into the vacuum recipient.

In one variant of the methods according to the invention generating the positively charged particles comprises cathode sputtering at least one solid material or liquid material target, particularly magnetron sputtering the at least one target.

In one variant of the methods according to the invention the cathode sputtering comprises providing a counter electrode with respect to the target, which counter electrode loops around the substrate.

In one variant of the methods according to the invention the at least one target is operated on the electric potential of the second electrode.

In one variant of the methods according to the invention generating the positively charged particles comprises magnetron sputtering and electrically supplying the sputtering by one of DC, pulsed DC, particularly by HIPIMS.

In one variant of the methods according to the invention generating the positively charged particles comprises performing magnetron sputtering with at least one of a planar magnetron source and of a magnetron source with cylindrical target drivingly rotatable around its axis.

One variant of the methods according to the invention comprises providing the substrate on a substrate holder and drivingly moving said substrate holder into and from a position whereat said substrate is in a coating position by a transport mechanism.

One variant of the methods according to the invention comprises conveying the substrate by means of a conveyer of the transport mechanism into and out of the vacuum recipient, particularly by one-directional movement of the conveyer.

One variant of the methods according to the invention comprises loading and unloading a substrate on and from a substrate holder by means of a robot.

Please note: Since the second electrode may become large in larger coating machines it may be a problem that the capacity to grounded walls of the vacuum coating chamber may become too high. In that case it may be advisable to use electrically floating metal interlayers between the second electrode and the grounded walls.

Each variant of the methods according to the invention may be realized in combination with one or more than one other variant unless being in contradiction.

The apparatus and the methods according to the invention shall now be further exemplified with the help of figures.

THE FIGURES SHOW

Figure 2:
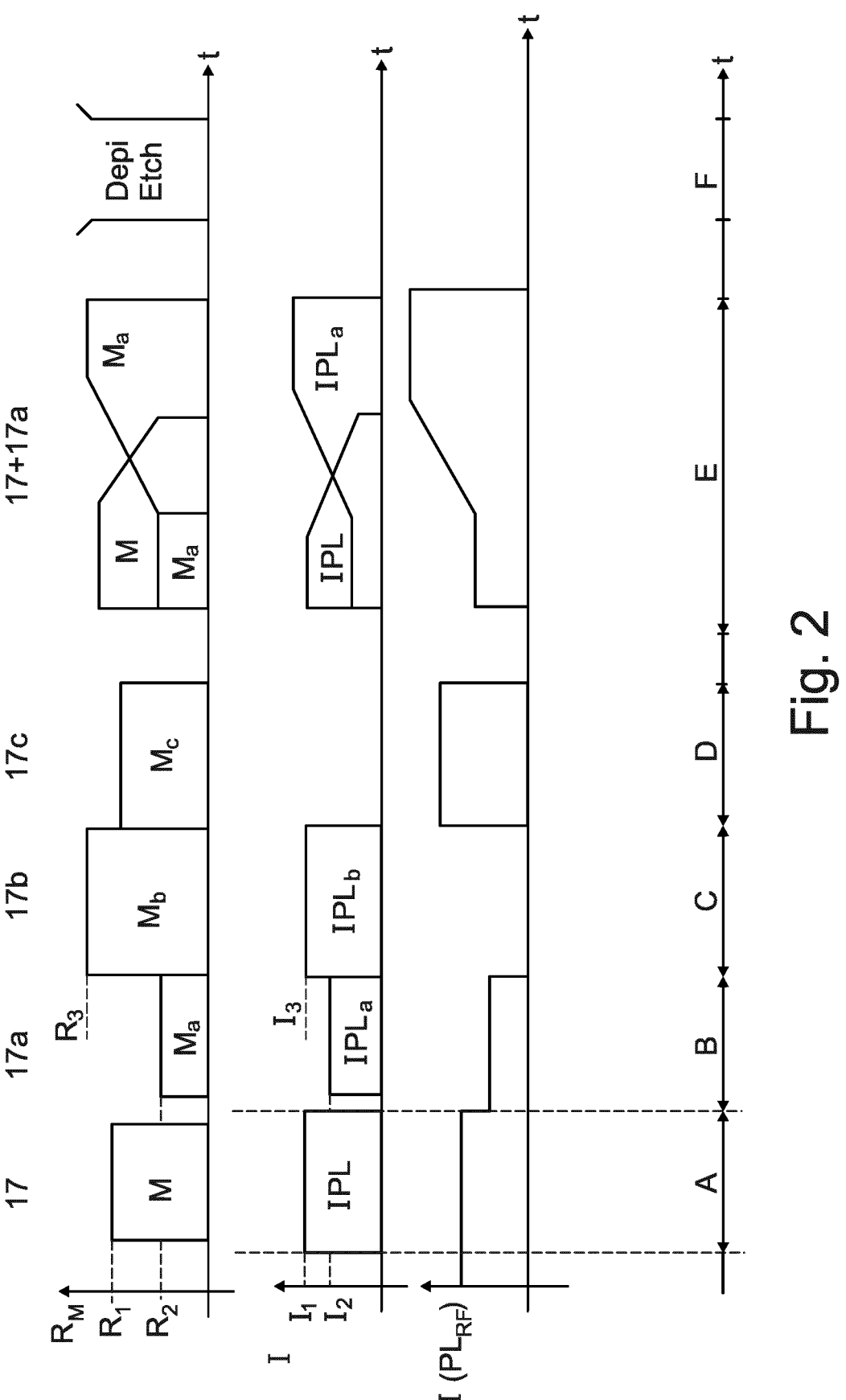

FIG. 1: schematically and simplified, a generic, principle-embodiment of the apparatus according to the invention, operating the methods according to the invention;

FIG. 2: over time axes, possible operating schemes of an apparatus and of methods according to FIG. 1

Figure 3:
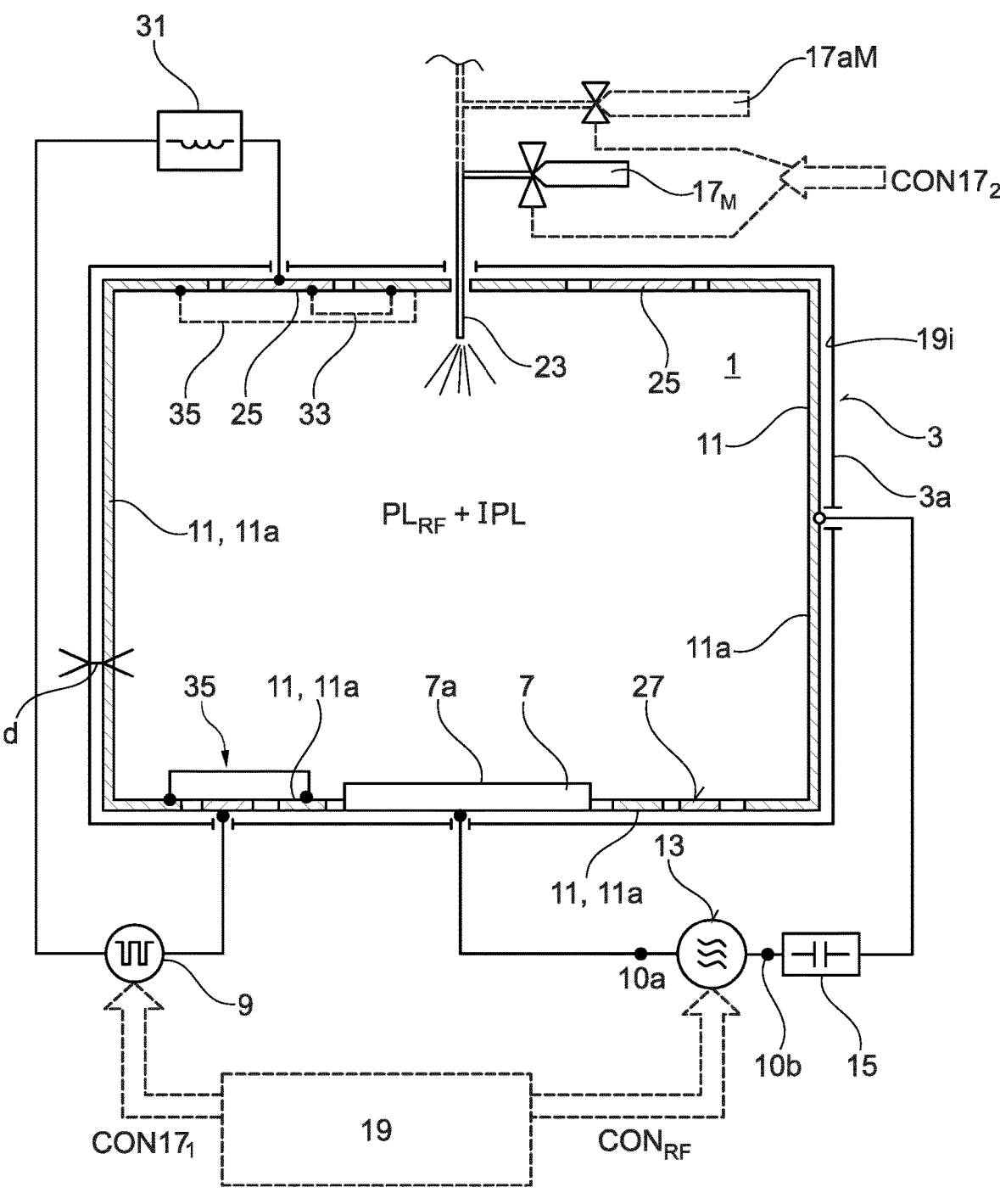
Figure 4:
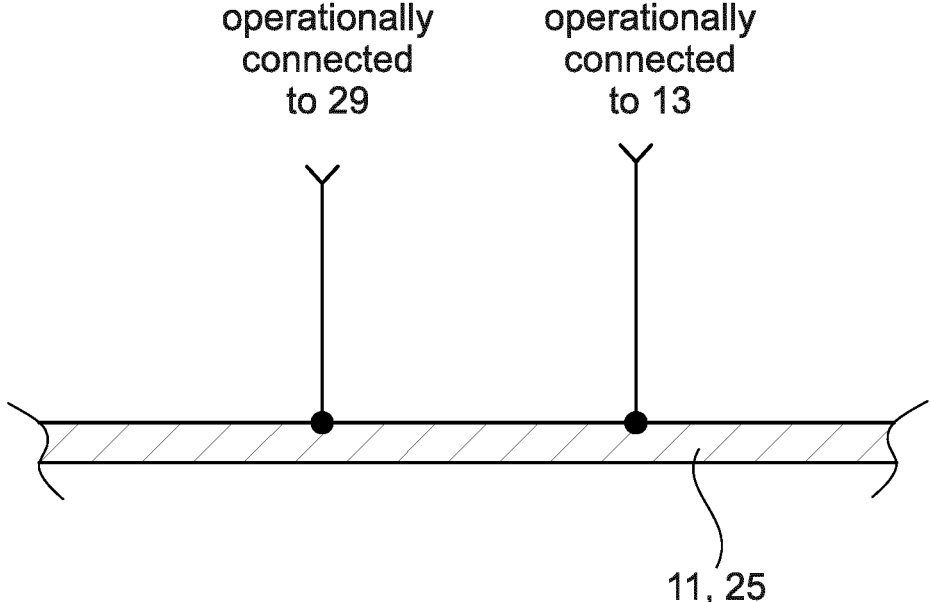
Figure 5:
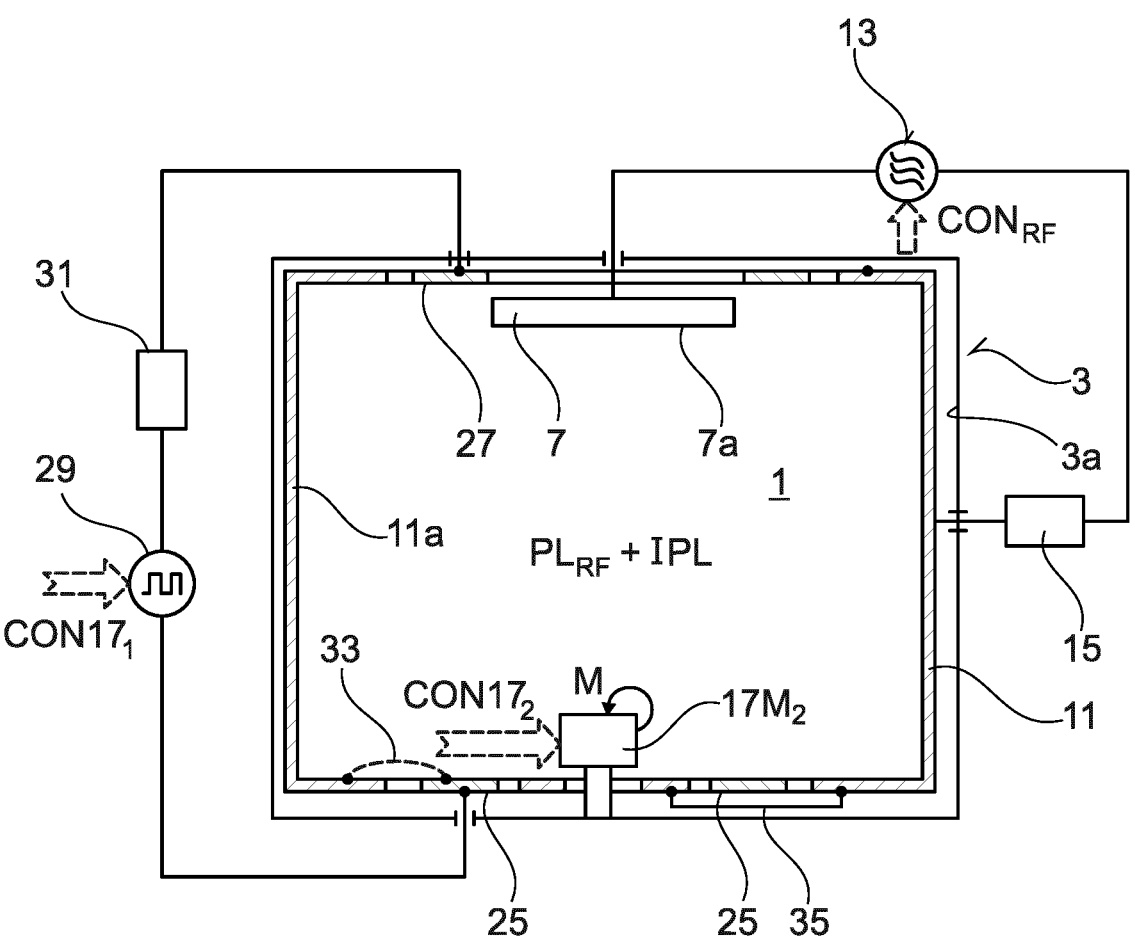
Figure 6:
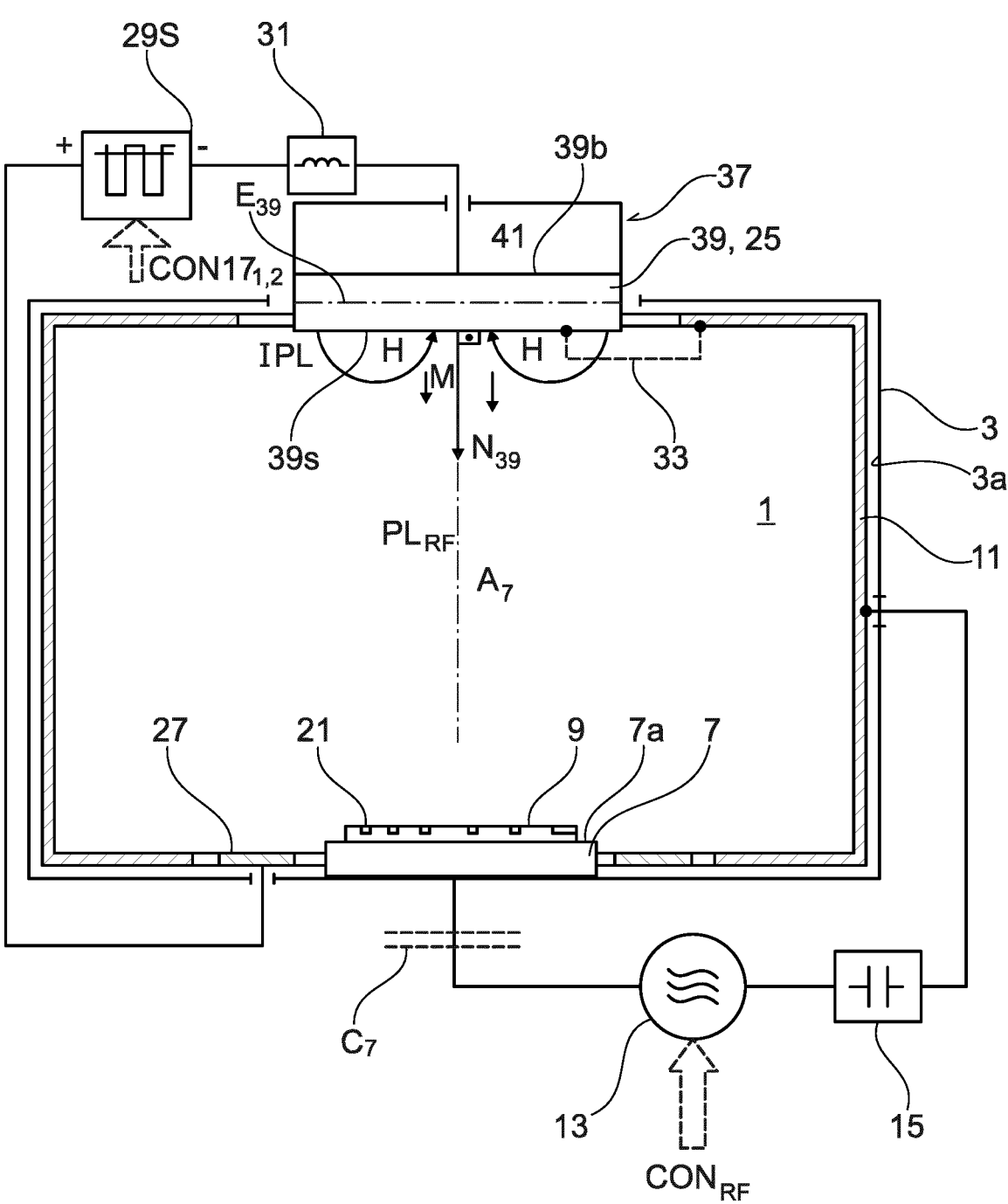
Figure 7:
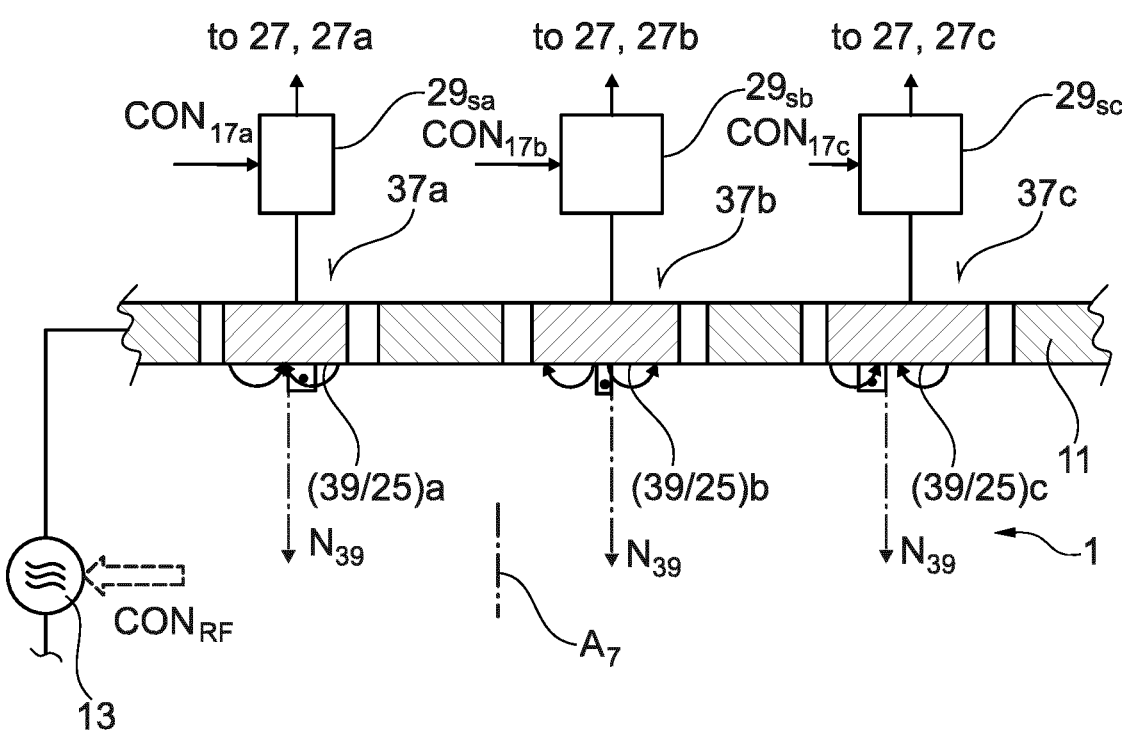
Figure 8:
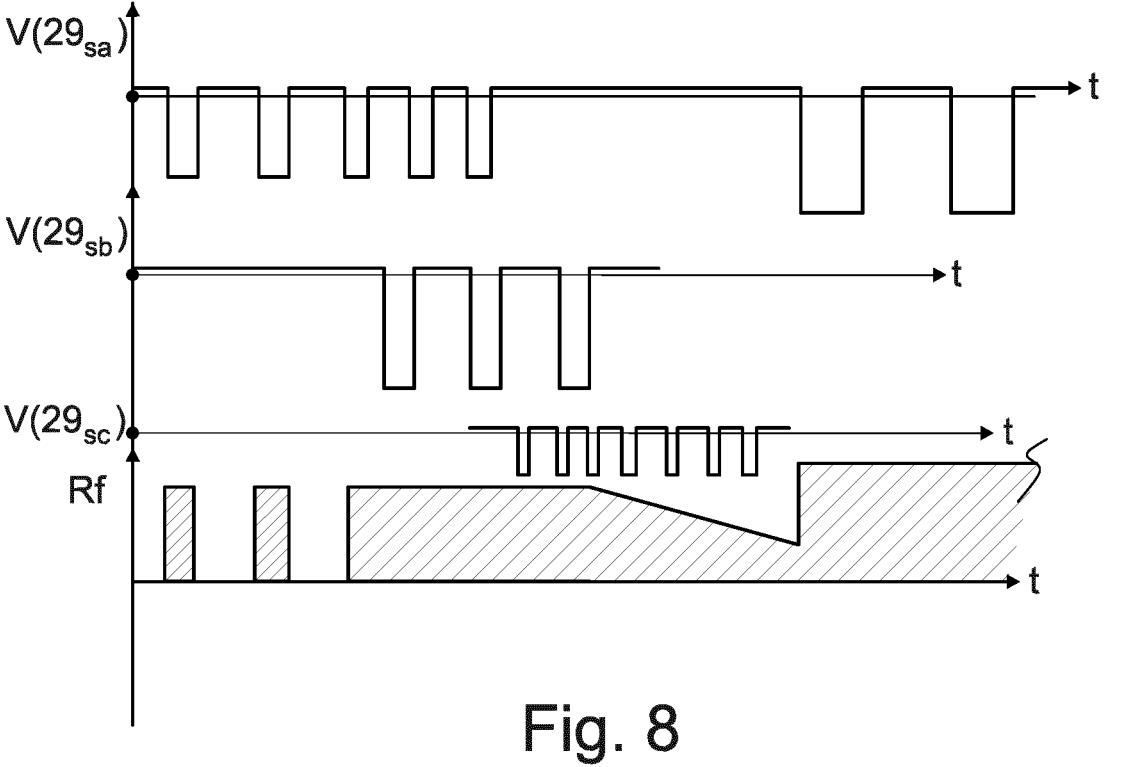
Figure 9:
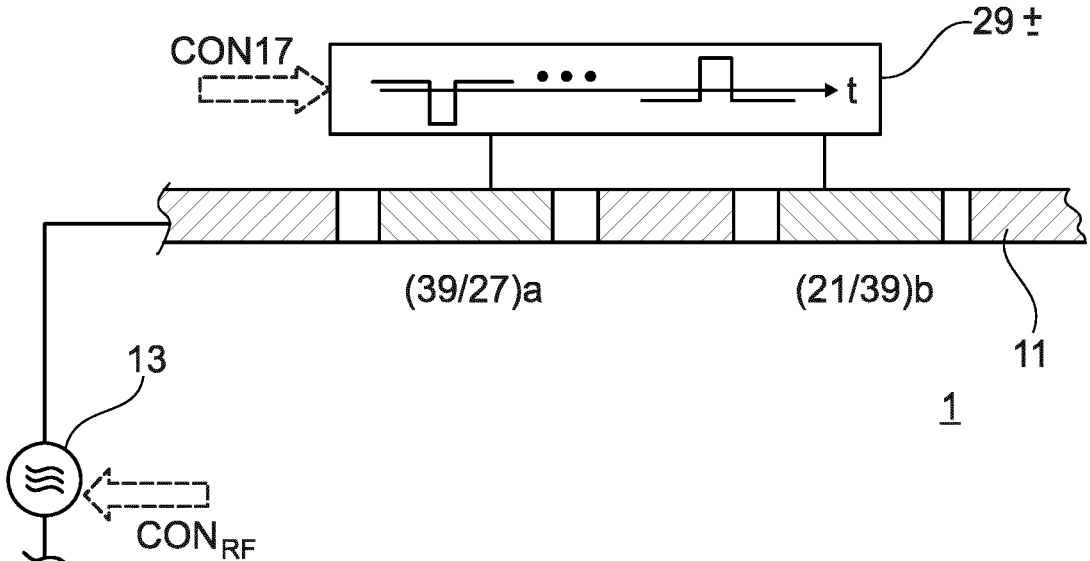
Figure 10:
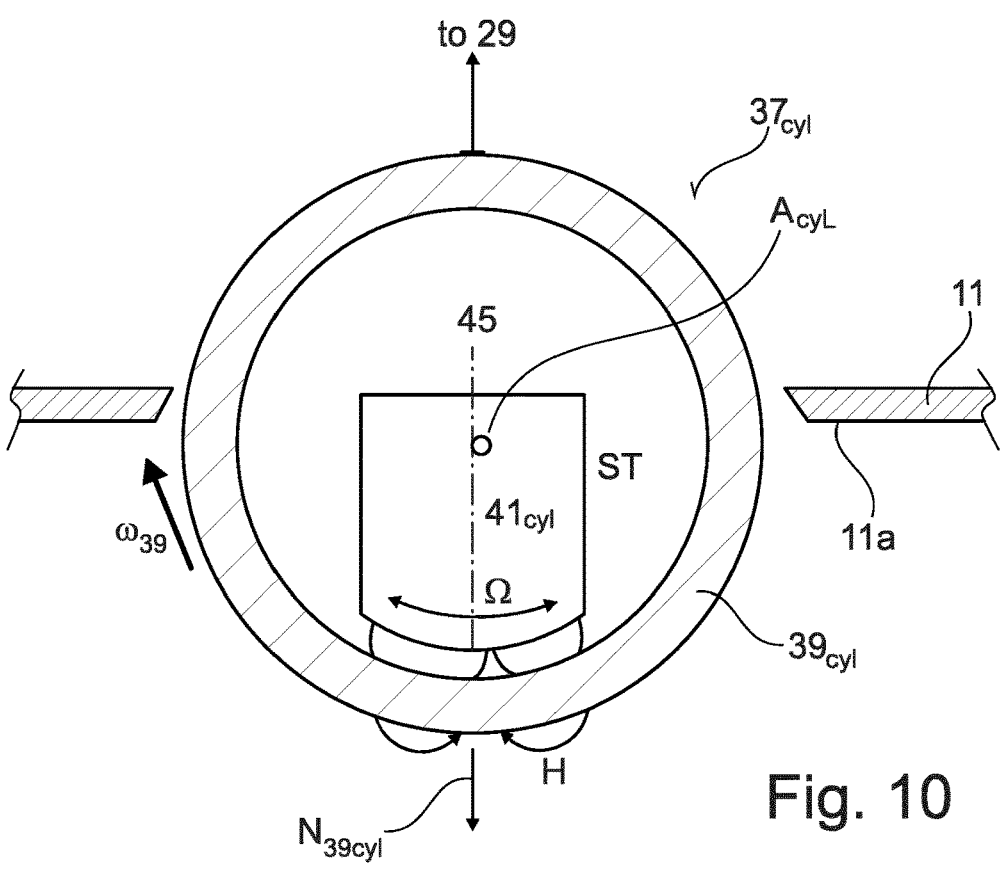
Figure 11:
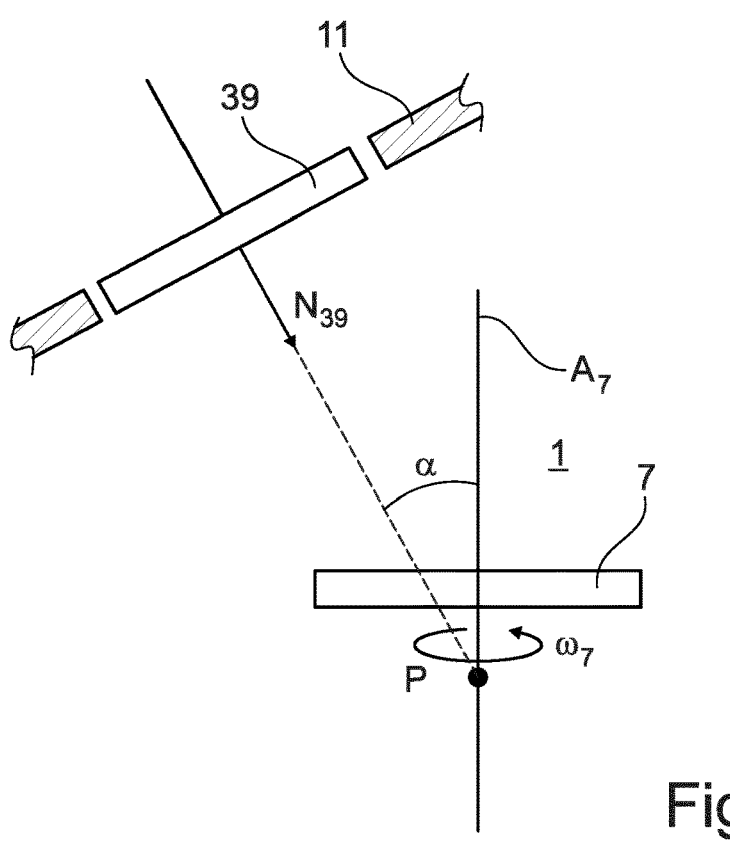
Figure 12:
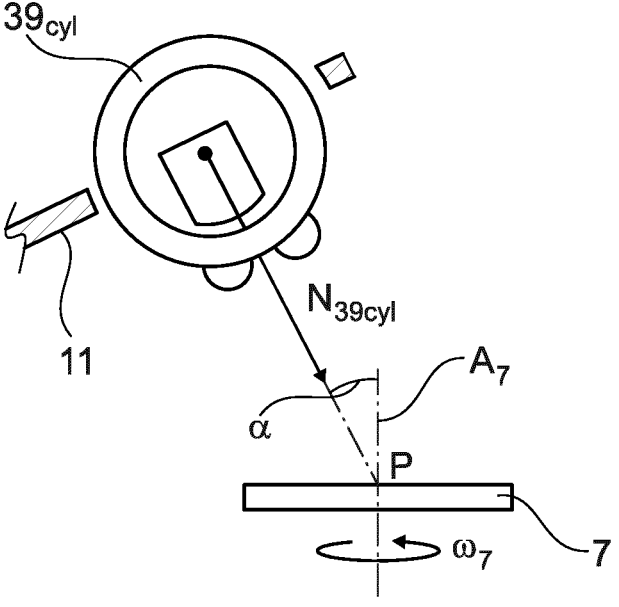
Figure 13:
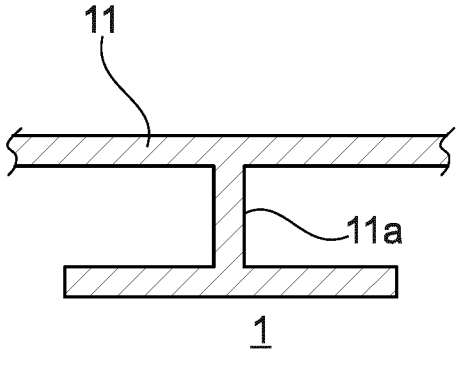
Figure 14:
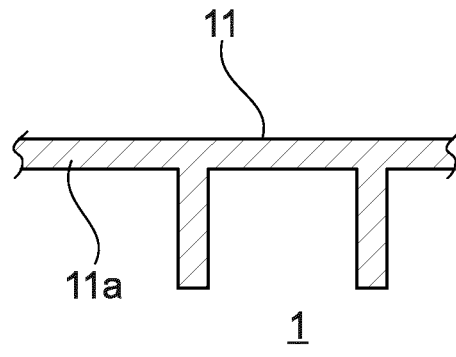

FIG. 3: Schematically and simplified, an embodiment of the apparatus according to the invention, operating variants of the methods according to the invention thereby generating material to be deposited on the substrate out of a gaseous phase, as e.g., for PECVD;

FIG. 4: schematically and simplified parts of common electrodes of an embodiment of the apparatus according to the invention, operating the methods according to the invention;

FIG. 5: Schematically and simplified, an embodiment of the apparatus according to the invention, operating variants of the methods according to the invention, wherein generating material to be deposited on the substrate comprises generating material out of a gaseous phase;

FIG. 6: Schematically and simplified, an embodiment of the apparatus according to the invention, operating variants of the methods according to the invention, wherein generating material to be deposited on the substrate comprises generating material out of a solid phase by cathode sputtering;

FIG. 7: schematically and simplified a part of an embodiment of an apparatus according to the invention, operating variants of the methods according to the invention, and comprising more than one cathode sputtering sources;

FIG. 8: in a representation in analogy to that of FIG. 2 operating schemes of an embodiment of an apparatus according to the invention with multiple plasmas supplied by pulsed DC;

FIG. 9: In a representation in analogy to that of FIG. 7 a part of an embodiment of an apparatus according to the invention, operating variants of the methods according to the invention;

FIG. 10: Schematically and simplified a sputtering source with cylindrical target as applicable to embodiments of the apparatus according to the invention, operating variants of the methods of the invention and realized with one or more than one cathode sputtering sources;

FIG. 11: schematically and simplified parts of an embodiment of an apparatus according to the invention and operating variants of the methods of the invention with tilted planar target;

FIG. 12: schematically and simplified parts of an embodiment of an apparatus according to the invention and operating variants of the methods of the invention with tilted cylindric target;

FIGS. 13 and 14: schematically and simplified, shapes of electrodes with enlarged electrode surface as applicable to embodiments of the apparatus of the invention, operating variants of the methods of the invention.

Figure 15:
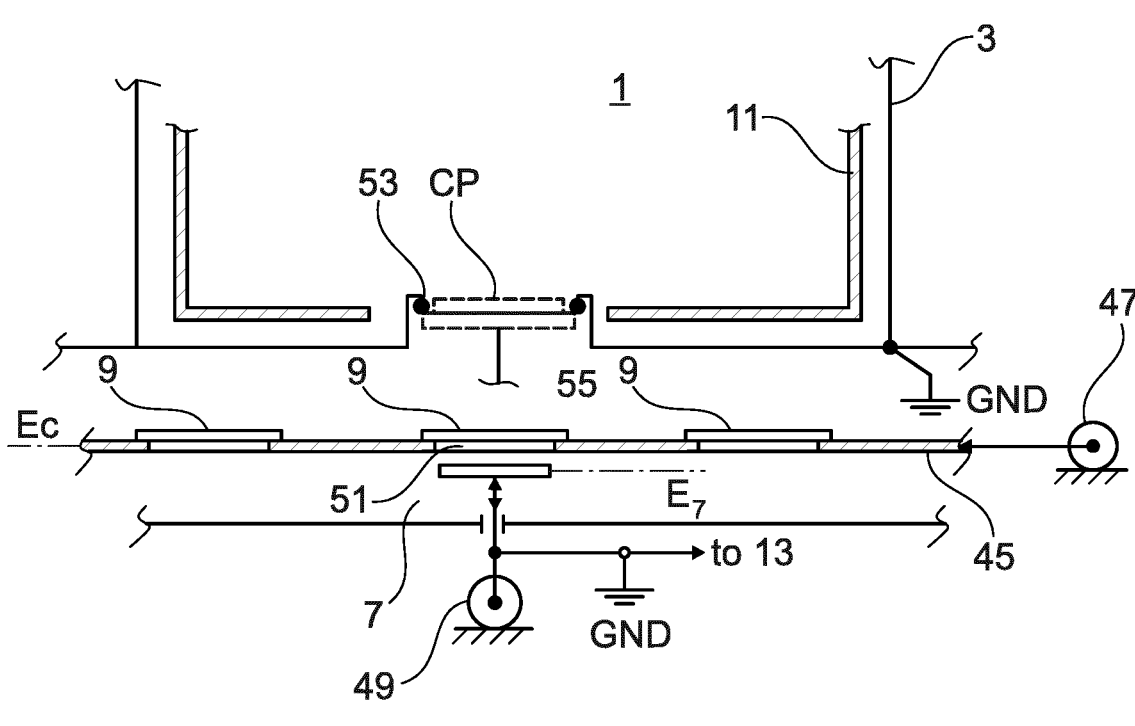
Figure 16:
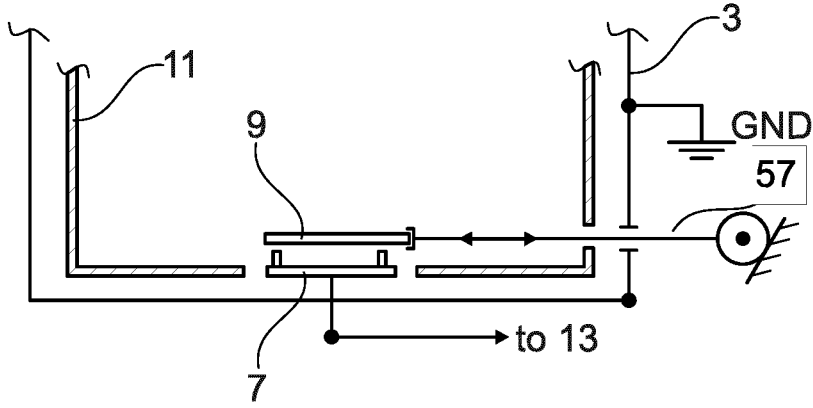

FIG. 15: Schematically and simplified parts of an embodiment of the apparatus according to the invention, whereat the substrate holder is a part of a transport mechanism;

FIG. 16: Schematically and simplified parts of an embodiment of the apparatus according to the invention in which substrates are loaded to and unloaded from the substrate holder by a robot.

FIG. 1 shows schematically and simplified the principle of a vacuum coating chamber according to the present invention, performing the methods according to the present invention.

Within an inner space 1 of a vacuum coating chamber 3, pumped by a vacuum pump 5, there is provided a substrate holder 7 with an extended surface 7a which is freely exposed to the inner space 1 if a substrate 9 to be coated is not applied thereon. Whereas the body 7b of the substrate holder 7 is of a metal, the extended surface 7a of the substrate holder 7, which is exposed to the inner space 1, as long as no substrate 9 resides thereon, may be of a metal or may be the surface of a dielectric material layer upon the metal body 7b of the substrate holder 7. In the latter case such layer represents a negligible electric impedance at the Rf frequency, e.g., of 13.56 MHz, generated by a Rf generator 13.

A first electrode comprises the substrate holder 7, which we therefore address as substrate holder/first electrode 7. A first electrode surface comprises the extended surface 7a as long as no substrate 9 is deposited on the substrate holder/ first electrode 7. The metal body 7b of the substrate holder/ first electrode 7 is operationally electrically Rf connected or Rf connectable to one tap 10a of the Rf generator 13.

The substrate holder 7 may be part of a transport mechanism for the substrate or may be loaded/unloaded by a robot, with the advantage that the vacuum coating chamber 3 is operated on the same electrical potential as the substrate holder 7. By this providing electrical insulators can be avoided in the transport mechanism and also the risk of parasitic plasma discharges can be minimized.

Embodiments for handling the substrates 9 are schematically and simplified shown in FIGS. 15 and 16 and will be addressed later.

If a substrate 9—be it of a dielectric material or be it covered with a dielectric material layer or be it becoming coated with a dielectric material layer by operation of the apparatus according to the invention or be it of a electro-conductive material-is deposited on the substrate holder/first electrode 7, in operation of the apparatus according to the invention, the surface of the substrate 9 exposed to the inner space 1 becomes at least a part of the first electrode surface, at least instead of a part of the extended surface 7a of the substrate holder/first electrode 7. This because the dielectric material layer or substrate represents a negligible impedance to the Rf signal applied by the Rf generator 13.

If, additionally to the extended surface 7a of the substrate holder/first electrode 7, further metal or dielectric thin-film coated surface areas are present, which are freely exposed to the inner space 1 and which are as well electrically operationally Rf-connectable or -connected to the one tap 10a of the Rf generator 13, such areas are as well parts of the first electrode surface. As schematically shown in FIG. 1 e.g., if the wall 3a of the vacuum coating chamber 3 as well as the tap 10a are on electric ground potential GND, the areas 7e of the wall 3a become parts of the first electrode surface.

The contribution of such areas 7e to the first electrode surface may be significantly reduced by realizing such areas by grids or lamellas and performing pumping of or feeding of gas into the inner space 1 through such grid- or lamella-areas 7e.

A second electrode 11 is electrically operationally Rf-connectable or -connected to a second tap 10b of the Rf generator 13. The second electrode 11 has a second electrode surface 11a exposed to the inner space 1 which surface is of metal or is the surface of a dielectric film on the metal electrode body, as was addressed in context with the first electrode comprising the extended surface 7a.

The electrical operational Rf connection of the second electrode to the tap 10b is, in one embodiment, established via a matchbox 15 and is DC blocked as schematically shown by capacitance C15, e.g., integrated in the matchbox 15. A DC blocking capacitance C7 may also be provided between the tap 10a and the substrate holder/first electrode 7. Between the first electrode surface and the second electrode surface there is generated a Rf plasma, $PL_{RF}$. The second electrode surface 11a is larger than the first electrode surface by at least a factor of 1.5. Therefor positively electrically charged particles p of the material to be deposited on the substrate 9 are directionally accelerated towards the surface of the substrate 9 in the Rf plasma $PL_{RF}$, as schematically shown by the arrows ACC.

At least one material source 17 is provided which is constructed to generate material particles of that material, which is to be deposited on the substrate 9, and which particles are electrically positively charged and spread in the inner space 1 of the vacuum coating chamber 3.

Such material source 17, on one hand, provides a gaseous or solid material, latter being evaporated, or cathode sputtered, and, on the other hand, provides an ionizing plasma to react and ionize the gaseous material or to ionize the evaporated or cathode-sputtered off solid. The same plasma may be exploited for evaporating or cathode sputtering the solid material and for ionizing same.

The two basic tasks of the material source 17 are schematically addressed in FIG. 1 on one hand by IPL for the ionizing plasma and by M for providing the material to be ionized.

As shown in dash lines, more than one such material source 17, 17a . . . may be provided, especially for different materials. Thereby one and the same ionizing plasma IPL may be exploited for electrically positively charging different materials Ma, Mb, . . . (not shown in FIG. 1) of the respective material sources 17a, 17b, . . . or different ionizing plasmas IPLa, IPLb, . . . may be used, respectively dedicated to the material sources 17a, 17b, . . . . Different ionizing plasmas may just be different by different intensities.

A source controller 19 may be provided, as shown in dash lines in FIG. 1. The source controller 19 may be configured, as schematically shown in FIG. 1 by the control connections CON 17:

to control ON/OFF operational timing, respectively at the one or at the more than one material sources 17, 17a, 17b . . . and/or.

to control, respectively, the material delivery rates at the one or at the more than one material sources 17, 17a, 17b . . . and/or.

to control, respectively, the intensity of the respective IPL at the one or more than one material sources 17, 17a, 17b . . . and/or as schematically shown as well in FIG. 1 by the control connections CON 13

ON/OFF timing of the Rf plasma $PL_{RF}$ and/or intensity of the Rf plasma $PL_{RF}$ FIG. 2 exemplifies the control possibilities for different materials M, Ma, Mb, . . . , delivered to the inner space 1 and timing thereof, different rates R thereof, of different ionizing plasmas and of their intensities IPL, IPLa, IPLb, . . . , and their timing at the material sources 17, 17a, 17b, . . . and of the intensity and timing of the Rf plasma, without referring to specific applications as practiced but just to exemplify the control flexibility which may be exploited.

During timespan-example A material source 17 is controlled to deliver material M at a rate R1, the IPL is switched ON at an intensity $I_1$. IPL may thereby be switched ON, as represented, in advance of the M delivery, and may be switched OFF after disabling delivery of M. The Rf plasma $PL_{RF}$ is enabled. During timespan-example B the material source 17a is controlled to deliver material Ma at a lower rate R2, IPLa and the Rf plasma $PL_{RF}$ are controlled on a reduced intensity. During timespan-example C the material source 17b is controlled to deliver material Mb at a rate R3 and its ionizing plasma IPLb is controlled on an intensity $I_3$. In this time span C the acceleration of positively charged material particles by means of the Rf plasma $PL_{RF}$ is disabled.

During timespan-example D the delivery of material Mc of the material source 17c is controlled on a respective rate (not marked in FIG. 2) the IPLC is switched OFF and thus the delivered material is only exposed to the Rf plasma $PL_{RF}$ controlled on a desired intensity, effecting only minimal ionization or no ionization.

During timespan-example E the delivery rate of the material M of the material source 17 is controlled to decrease, whereas the delivery rate of Ma of material source 17a is controlled to increase. In analogy, the intensity of IPL of the material source 17 is controlled to decrease, whereas the intensity of IPLa of material source 17a is controlled to increase. The intensity of the Rf plasma $PL_{Rf}$ is controlled to increase.

During the timespan-example F none of the material sources is operative and, instead, a different coating process or an etching process is performed in the inner space 1 of the vacuum coating chamber 3, as schematically represented in the FIG. 2 by "Dep; Etch".

Thus it might be appreciated that, dependent on the respectively realized embodiment and the intended application of the apparatus and of the methods according to the invention, material delivery, and/or ionizing plasma intensity, and/or Rf plasma intensities and/or all timings may be controlled highly flexibly by the source controller 19, if needed.

Turning back to FIG. 1. the substrate holder/first electrode 7 may be stationary or, especially if constructed to hold circular-disk shaped substrates, drivingly rotatable around its central axis, as addressed at $A_7$ and by the arrow $\omega_7$.

The second electrode 11 is provided along a largely predominant part of the inner surface of the wall 3a of the vacuum coating chamber 3. The spacing d between the inner surface of the wall 3a and the second electrode 11 is selected to be smaller than the dark space distance valid at a pressure within the inner space 1 for a desired, predetermined coating process. Thus, no Rf plasma may burn in the interspace between the inner surface of the wall 3a and the second electrode 11.

The second electrode surface 11a is larger than the first electrode surface by at least a factor of 1.5. The result is that the drop of electric potential from plasma potential to the potential of the first electrode surface and thus to the surface 7a of the substrate holder/first electrode 7 becomes larger, significantly larger, than the respective potential drop to the second electrode surface 11a.

Thereby the electrically positively charged material particles p of the material to deposited on the substrate 9 and spread into the inner space 1 become directionally-substantially perpendicularly to the surface 7a-accelerated towards and on the surface of a substrate 9, which resides on the extended surface 7a of the substrate holder/first electrode 7.

Such vacuum layer deposition chamber 3 is especially suited to practice deposition of the material to be deposited on the substrate 9 also into vias, trenches or, more generically, indentations in the surface of the substrate 9 to be coated, and having an aspect ratio e.g., higher than 3:1, Definition:

We understand under the term "aspect ratio" the ratio of the maximum depth of an indentation to its minimum cross-sectional diameter.

FIG. 3 shows schematically and simplified an embodiment of the vacuum layer deposition apparatus according to the present invention and operating the methods according to the invention. In FIG. 3 parts of the apparatus which were already described in context with FIG. 1 are addressed with the same reference signs.

In the embodiment of FIG. 3, the material source 17 or the sources 17a, 17b, . . . as generically addressed in FIG. 1, which generate positively charged particles of the material or of the materials to be deposited on the substrate 9, especially on a substrate 9 with indentations 21 (see FIG. 1) comprise, on one hand, respective gas tanks 17M, 17aM . .

. containing a respective reactive gas being controllably discharged, via gas feeds 23, into the inner space 1. On the other hand, the addressed material sources 17, 17a . . . as of FIG. 1 comprise, commonly, a pair of electrodes 25 and 27 electrically operationally Rf connected or -connectable to a supply source 29, which e.g. generates a DC supply or a pulsed DC supply, as particularly a HIPIMS supply.

In the embodiment according to the example of FIG. 3, the electrode 25 is realized as a ring electrode within a ring spacing of the second electrode 11, and the electrode 27 is as well realized by a ring electrode in a ring spacing in the second electrode 11, substantially opposite the electrode 25 and around the substrate holder/first electrode 7. The supply source 29 may be protected from Rf by a protection filter 31, acting as a low pass filter, and realized by or including an inductive, impedance as schematically shown. Between the electrodes 25 and 27 the ionizing plasma IPL is generated, in this embodiment commonly for the material sources 17, 17a . . . with the respective material delivery gas tanks 17M, 17aM, . . . .

If needed the source controller 19 may control the intensity and/or timing of the IPL via control connection $CON17_1$, may control timing and/or rate of material delivery via control connection $CON17_2$, intensity and timing of the Rf plasma $PL_{RF}$ via control connections $CON_{RF}$.

This embodiment is especially suited for PECVD processes. If e.g., the substrate holder/first electrode 7 is equipped with a heater (not shown in FIG. 3) the plasmas IPL and $PL_{Rf}$ may be disabled and a mere thermal CVD process may be practiced, according to the operation in timespan-example F in FIG. 2.

So as to avoid too much reduction of the second surface 11a by the electrodes 25 and 27, the electrode 25 may be electrically connected to the second electrode 11 as schematically shown in dash lines at the connection 33. This in fact results in commonly realized both electrodes 11 and 25 as schematically shown in FIG. 4. Clearly and according to the embodiment of FIG. 3 all parts of the second electrode 11 are electrically interconnected, as schematically shown by the electric connections 35.

In the embodiment of FIG. 3, the one or more than on reactive gas or gases are reacted and ionized in the IPL and the resulting reacted and positively charged gaseous material particles are directionally accelerated in the Rf plasma $PL_{RF}$ towards the extended surface 7a and thus towards the surface of a substrate deposited on that surface 7a.

Instead of realizing the IPL between two electrodes, as of electrodes 25 and 27 as shown in the FIG. 3, DC−, pulsed DC−, thereby possibly HIPIMS-supplied, another type of plasma can be used, e.g., a microwave plasma. This may be realized e.g. by tailoring and exploiting the gas feed 23 to couple microwave power from a microwave generator into the inner space 1.

In the embodiment of FIG. 5 the same reference numbers are applied for parts which have already been addressed in context with FIGS. 1 to 4.

The difference of the embodiment according to FIG. 5 and of the embodiment according to FIG. 3 is, that, according to the embodiment of FIG. 5, the material M delivered by the material source 17 into the inner space 1 is based on a solid, possibly even on a liquid, whereas the material M delivered into the inner space of the embodiment according to FIG. 3 is based on a gas. The material source 17 applied in the embodiment of FIG. 5 comprises on hand an electron beam evaporator 17 Me for material M delivery and, on the other hand, on the pair of electrodes 25, 27 and the supply source 29, in analogy to the embodiment of FIG. 3. The substrate holder 7 mounts the substrate in the top of the chamber since evaporation sources are usually mounted on the bottom to avoid spill-out of the crucible. Also here the substrate holder/first electrode 7 may advantageously be operated on ground potential and may be part of or may be served by a transport mechanism operated as well on ground potential. Consequently, and if needed, the overall control of the material source is performed, much in analogy to such control in the embodiment of FIG. 2, on one hand by $CON17_1$ upon the IPL, and, on the other hand, by $CON17_2$ on the rate of delivered material M, i.e. on the electron beam evaporator $17M_e$. Beside of the different material source 17 with the electron beam evaporator $17M_e$ the apparatus according to the embodiment of FIG. 5 is substantially equal to that of FIG. 3 and needs not be further described to the skilled artisan.

FIG. 6 shows, schematically and simplified, an embodiment in which the material source of positively charged particles of the material to be deposited on the substrate 9, according to the material-source 17 of FIG. 1, delivers material M into the inner space 1 based on solid material. In FIG. 6 parts of the apparatus which were already referred to in context with the FIGS. 1 to 5, are addressed with the same reference signs.

Opposite the substrate holder/first electrode 7 there is provided a cathode-sputter source, in this embodiment a magnetron sputter source 37 with a target 39 electrically isolated from the wall 3a of the vacuum coating chamber 3. Behind the target 39, as schematically shown in a magnet compartment 41, magnetron magnets (not shown) are drivingly moved along the backside 39b of the target 39. They generate, as perfectly known to the artisan skilled in magnetron sputtering art, a moving pattern of magnetron magnetic field H swept along the sputtering surface 39s of the target 39.

The cathode-sputter source, realized as a magnetron sputter source 37, is supplied by a DC-supply or, as shown in FIG. 6, by a pulsed DC supply source 29s, in one embodiment by a HIPIMS supply source 29s which generates, at its negative output, high negative voltage pulses with respect to the electric potential at the positive output. Via the protection filter 31, realized e.g., by an inductance, the negative output of the pulsed DC supply source, in one embodiment realized as a HIPIMS supply source, is connected to the target 39. The protection filter 31 might be provided, if at all necessary, to limit the current rise of the pulses of the pulsed DC supply source 29s, in the one embodiment of the HIPIMS supply source-to the target 39. The target 39 accords in fact with the electrode 25 in the embodiments of FIGS. 3 and 5 and cooperates with electrode 27 operationally connected to the positive output tap of the supply source 29s. The target is therefore referenced by 39/25.

To achieve sufficient IPL either a high DC power density may be applied on a small target, or a pulsed DC power may be applied on a larger target. The power density should be >1 W/mm2.

E.g. a small planar magnetron target with a radius of e.g. 50 mm should be run with 8 kW DC.

Alternatively, e.g. a large planar magnetron target with a radius of 200 mm should be run with pulsed DC of 130 kW in the pulses, but with a duty cycle of 10%, so that the average power becomes 13 kW.

Thus, the material source 17 as of FIG. 1 is realized on one hand, by the target (39,25) delivering, by being sputtered, the material M into the inner space 1 and, on the other hand, by the DC pulse supplied electrodes, the target 39,25 and the electrode 27 thereby generating the IPL of the material source 17.

In opposition to customary sputter sources, the counter-electrode 27 to the target 39/25 is positioned, in one embodiment, far distant from the target 39,25 and not around the target, which improves distribution of the plasma IPL and thus of the positively charged sputtered off particles over the inner space 1, thereby avoiding an excessive electron current to the substrate holder/first electrode 7 and thus the substrate 9.

In one embodiment, irrespective of the kind of electric supply of the cathode sputtering source, according to the magnetron sputtering source 37, and irrespective of the realization of the sweeping magnetron magnetic field H, the target 39/25 which is of a electroconductive material, customarily of metal, may be short-circuited to the second electrode 11 as schematically shown by the electrical connection 33, much in analogy to the respective connection 33 in the embodiments of FIGS. 3 and 5 and to FIG. 4. Thereby, again, the second electrode surface 11a of the second electrode 11 is increased, namely by the sputtering surface 39s of the target 39,25.

If reactive cathode sputtering is to be performed, at least one gas feed line (not shown in FIG. 6) is provided, spreading a reactive gas from a gas tank, which contains the reactive gas, into the inner space 1.

Please note, that in the embodiment according to FIG. 6, control of the timing and/or of the intensity of IPL and of the material delivery rate is, if desired at all, established from a source controller (not shown in FIG. 6) to the supply source 29s, as shown by CON171,2 because the sputtering rate and the intensity of the IPL are mutually dependent. If the supply source 29s is realized by a pulsed DC sources, the duty cycle, the respective pulse repetition period, the respective pulse amplitude may be set, controlled and possibly varied over time.

Providing more than one of the material sources 17 as generically addressed in context with FIG. 1, shall be exemplified with the help of FIG. 7 thereby exemplifying multiple cathode sputter sources, especially multi magnetron sputter sources 37 according to FIG. 6, namely 37a, 37b, 37c . . . . FIG. 7 thereby shows schematically and simplified a part of the second electrode 11 e.g. according to the embodiment of FIG. 6, the cathode sputter sources 37a to 37c comprising, respectively, targets 39 which act as electrodes 25 and which are therefore addressed by the reference numbers (39/25)$_a$ to (39/25)$_c$.

In the embodiment of FIG. 7, the targets (39,25) x are electrically separate from the second electrode 11, which allows to supply each of the targets (39,25)$_x$ by an independent supply source 29sa to 29sc, in one embodiment, realized by respective DC– or pulsed DC– supply sources, thereby in one embodiment, HIPIMS sources, according to the supply source 29s of the embodiment of FIG. 6. Alternatively or additionally (not shown) a DC– or pulsed DC– thereby possibly a HIPIMS-supply source may be switched in a time-multiplexing manner from one or more than one targets (39,25) to one or more than one subsequent target (39,25), thereby possibly adapting the output power delivered to the momentarily activated targets, by the source controller 19 (not shown in FIG. 7).

Each of the supply sources 29sa, 29sb . . . may further be operationally connected to a common electrode 27, according to the embodiment of FIG. 6, and/or at least some of the supply sources 29sa, 29sb . . . may be operationally connected to a dedicated electrode 27a, 27b, 27c . . . .

If needed, the supply sources 29sa, 29sb . . . may be controlled, here as well, from a source controller 19 (see FIG. 1) via the control connections CON17a, CON17b . . . . If the supply sources 29sa, 29sb . . . are realized by pulsed DC sources, the time span during which the respective supply source is enabled, the respective duty cycle, the respective pulse repetition period, the respective pulse amplitude may be set, controlled and possibly varied over time.

This flexibility of control is exemplified infig.8. which shows possible voltage courses V applied by the supply sources 29sa, 29sb . . . between the targets (39/25)a, (39/25)b . . . and the respective counter electrodes 27.

Further, and exemplified as well in FIG. 8, ON/OFF timing and Rf power delivered to the first and second electrodes, between which the Rf plasma PL$_{Rf}$is generated, may be controlled by the source controller 19 via the control connection CON$_{RF}$. It is to be noted that Rf power is normally ON during each or at least most of the ionizing DC pulses of the supply source 29s or the supply sources 29sa, 29sb . . . .

The independent control of the sources 29sa, 29sb . . . of FIG. 7 can be used for mixing different kind of materials from targets (39/25)a, (39/25)b, . . . . Targets (39/25)a, (39/25)b . . . of equal material may be alternatively or additionally used, for coating extended surface areas of the substrate. ON/Off—activation—timing and the intensity of each target sputtering can be set to control the uniformity of the deposition.

A different approach of electrically supplying two targets of an embodiment of the apparatus according to the invention is schematically and simplified shown in FIG. 9, in a representation in analogy to that of FIG. 7. The supply source 29+– interconnects the two targets (39/27) a and (27/39)b with alternate electrical polarity, as is schematically shown in FIG. 9 for a pulsed DC supply. Either pulse polarity is inversed after each pulse or pulse polarity is inverted after a pulse-series of controllable time extent. No distinct electrode 27 as is provided in the embodiments of FIG. 5 is provided: Alternatingly one of the targets 39a, 39b becomes the electrode according to the electrode 27, the other target is the electrode 25, as schematically addressed in FIG. 9 by the references (39/27)a and (27/39)b.

Again, and if needed, the timing of polarity-inversion and/or the pulse characteristics, namely pulse amplitude, pulse length, duty cycle, may be controlled by the source controller 19, via the control connection CON 17.

As we addressed in context with generic embodiment of FIG. 1, in all embodiments exemplified up to now the substrate holder/first electrode 7 may be rotated relative to the one or the more than one material sources 17, around the central axis A$_7$ of the substrate holder/first electrode 7 (see FIG. 1). In one embodiment, the one or more than one material sources 17 are stationary, the substrate holder/first electrode 7 is rotated.

With an eye on the embodiments in which the material source 17 or the material sources 17, 17a, 17b, . . . comprise one or more than one magnetron sputter sources, the respective targets have been represented extending along a plane E$_{39}$ (see e.g. FIGS. 6), are so called planar targets. All the single and multiple magnetron sputter sources in all embodiments described up to now, and which have been shown throughout the figures as planar magnetron sputter sources with targets 39 respectively extending along a plane E$_{39}$ as shown in FIG. 6, may respectively be replaced by magnetron sputter source or -sources with a cylindrical target. FIG. 10 shows schematically and simplified such cylindric-target magnetron sputter source $37_{cyl}$ with cylindrical target $39_{cyl}$.

The cylindric magnetron sputter source $37_{cyl}$ comprises a cylindrical target $39_{cyl}$ which is drivingly rotatable—$\omega_{39}$—around its central axis $A_{cyl}$. Inside the hollow space 45 of the cylindrical target $39_{cyl}$ there is provided the magnet compartment $41_{cyl}$ with the magnetron magnets (not shown) generating the magnetron magnetic field H. The magnet compartment $41_{cyl}$ with the magnetron magnets may be stationary as schematically shown at ST or may be drivingly oscillating around the axis $A_{cyl}$ as addressed by $\Omega$.

As was addressed, such cylindrical magnetron sputter source 37 may replace one or all of the planar magnetrons as in the FIGS. 6, 7, 9. The cylindrical target $39_{cyl}$ may as well be operated on the same electric potential as the second electrode 11, thereby enlarging the second electrode surface 11$a$. The cylindrical magnetron sputter source or -sources may be controlled as was explained for the planar magnetron sources.

As shown in the embodiments of FIGS. 6, 7 and as exemplified to now, a central normal $N_{39}$ of the planar targets, perpendicular to the plane $E_{39}$, extends parallel to the center axis $A_7$ of the substrate holder/first electrode 7. The embodiment of the cathode sputtering source according to FIG. 10 such central normal $N_{39cyl}$ may be defined in a plane incorporating the axis $A_{cyl}$ and in the center of the length extent of the cylindric target $39_{cyl}$. In this case too, the central axis $N_{39cyl}$ in one embodiment extends parallel to the axis $A_7$.

FIG. 11 and FIG. 12 show schematically and simplified, in a representation in analogy to those of FIGS. 7 and 9, embodiments of the apparatus according to the invention and operating the methods according to the invention, in which normals $N_{39}$, $N_{39cyl}$ of one or of more than one targets 39, $39_{cyl}$ intersect the axis $A_7$ by an angle $\alpha$ for which there is valid $$2° \leq \alpha \leq 30°.$$

Thereby only one target 39 or 39$cyl$ may be provided which is tilted as addressed or more than one targets. The intersection point P of the normal or of the normals $N_{39}$, $N_{39cyl}$ may be on or close to the surface of a substrate residing on the Substrate holder/first electrode 7.

The second electrode surface 11$a$ may further be enlarged by respective shaping of the second electrode 11 as exemplified in the FIGS. 13 and 14. This shaping may be done by fins or plates solidly connected to the second electrode 11 with the requirement that the plasma can distribute within resulting cavities.

Departing from the generic description as of FIG. 1 of the apparatus and the methods according to the invention FIG. 16 shows parts of an embodiment comprising a conveyer 45. The conveyer is controllably driven by a drive 47 along a plane $E_C$ parallel to the plane $E_7$ along which the extended surface 7$a$ of the substrate holder/first electrode 7 extends. The conveyer 45 carries more than one substrate 9 and conveys them, driven by the drive 47, mono-directionally into a position aligned with the substrate holder 7. The substrate holder 7, first in a position beneath the conveyer 45, is controllably driven by a drive 49 upwards, through a handling opening 51 in the conveyer 45 and lifts the respective substrate 9 upwards into coating position as shown at CP in dash lines. If necessary, by lifting the substrate holder 7 in coating position and also shown in dash lines with seal 53, the inner space 1 may become sealed with respect to a transport compartment 55 wherein the conveyer resides.

According to the embodiment of FIG. 16 the substrate holder/first electrode 7 is stationary and a substrate 9 is loaded to and unloaded from the substrate holder/first electrode 7 by a controllably driven robot 57.

Please note that also in the embodiments according to the FIGS. 15 and 16, the substrate holder/first electrode 7 is operated on ground potential GND.

It is perfectly clear to the skilled artisan that load locks, monodirectional or bidirectional, have to be provided there where substrate handling is performed between compartments operated at different pressures and trough ambient/vacuum interfaces.

What is claimed is:

1. A vacuum layer deposition apparatus comprising
   a vacuum coating chamber with an inner space;
   a material source constructed to generate electrically positively charged particles of a material to be deposited on a substrate in said inner space;
   a substrate holder with an extended metal or dielectric material surface exposed to said inner space; and
   a Rf plasma source comprising:
      a first electrode electrically operationally Rf-connectable or electrically operationally Rf-connected to a first tap of a Rf generator;
      a second electrode electrically operationally Rf-connectable or electrically operationally Rf-connected to a second tap of said Rf generator;
   wherein said first electrode comprising a first electrode surface of metal or of a dielectric material and is that part of an overall surface of said first electrode which is freely exposed to said inner space;
   wherein said second electrode comprising a second electrode surface of metal or of a dielectric material and is that part of an overall surface of said second electrode which is freely exposed to said inner space;
   wherein said extended surface of said substrate holder being at least a part of said first electrode surface; and
   wherein said second electrode surface being larger than said first electrode surface by at least a factor of 1.5.

2. The vacuum layer deposition apparatus according to claim 1, wherein said substrate holder as well as said vacuum coating chamber are connected to electric ground potential.

3. The vacuum layer deposition apparatus according to claim 2, comprising a transport mechanism for said substrate holder adapted to transport said substrate holder into and from a position wherein a substrate on said substrate holder is in coating position.

4. The vacuum layer deposition apparatus according to claim 1, comprising a robot adapted to load and respectively unload a substrate on and respectively from said extended surface.

5. The vacuum layer deposition apparatus according to claim 1, wherein at least a part of said second electrode extends opposite and facing said substrate holder.

6. The vacuum layer deposition apparatus according to claim 1, said material source which is constructed to generate said electrically positively charged particles comprises a source of material and a further plasma source constructed to ionize material delivered from said source of material.

7. The vacuum layer deposition apparatus according to claim 6, wherein said further plasma source comprises a third electrode and a fourth electrode respectively electrically operatively connected or respectively electrically connectable to taps of a further generator, said third and fourth electrodes being exposed to said inner space.

8. The vacuum layer deposition apparatus according to claim 7, wherein one of said third and of said fourth electrodes is common with said second electrode.

9. The vacuum deposition apparatus according to claim 7, wherein one of said third and of fourth electrodes is located electrically isolated from and around said substrate holder.

10. The vacuum deposition apparatus according to claim 7, wherein said further generator is a DC generator or a pulsed DC generator.

11. The vacuum deposition apparatus according to claim 10, wherein said further generator is a HIPIMS generator.

12. The vacuum deposition apparatus according to claim 1, wherein said material source which is constructed to generate said electrically positively charged particles comprises at least one source of material, which comprises at least one gas feed line discharging gaseous material into said inner space and in flow connection with a gas tank containing a gas.

13. The vacuum layer deposition apparatus according to claim 1, wherein said material source, which is constructed to generate said electrically positively charged particles, comprises at least one source delivering material from a solid or from a liquid.

14. The vacuum layer deposition apparatus according to claim 13, wherein said at least one source delivering solid material is a cathode sputter source and a target of said cathode sputter source is one electrode of a further plasma source.

15. The vacuum layer deposition apparatus according to claim 14, wherein said cathode sputter source is a magnetron sputter source.

16. The vacuum layer deposition apparatus according to claim 15, said magnetron sputter source being a planar magnetron sputter source or a magnetron sputter source with a cylindrical solid material target drivingly rotatable around the axis of said cylindrical target.

17. The vacuum layer deposition apparatus according to claim 1, comprising a source controller operatively connected to control inputs of said Rf-generator and constructed to control at least one of ON/OFF-timing of said Rf generator and of output power of said Rf generator.

18. The vacuum layer deposition apparatus according to claim 1, wherein said material source, constructed to generate said electrically positively charged particles, comprises a source of material and a further plasma source constructed to ionize material delivered from said source of material and operatively connected to an electrical supply source, further comprising a source controller operatively connected to control inputs of said electrical supply source and constructed to control at least one of ON/OFF-timing of said electrical supply source and of output power of said electrical supply source.

19. The vacuum layer deposition apparatus according to claim 18, comprising more than one of said material sources, said source controller being operatively connected to more than one of said material sources and being constructed to control mutual ON/OFF timing of said more than one material sources.

20. The vacuum layer deposition apparatus according to claim 1, wherein said material source constructed to generate said electrically positively charged particles comprises a source of material and a further plasma source constructed to ionize material delivered from said source of material and said further plasma source comprises a third electrode and a fourth electrode respectively electrically operatively connected or respectively electrically connectable to taps of a further generator, said source of material being a cathode sputter source and a target of said cathode sputter source being one of said third and of said fourth electrodes.

21. The vacuum layer deposition apparatus according to claim 1, comprising a transport mechanism constructed to convey a substrate into and out of a coating position in said vacuum coating chamber and wherein said substrate holder is a part of said transport mechanism.

22. The vacuum layer deposition apparatus according to claim 21, said transport mechanism comprising a conveyer drivingly movable along a plane parallel to said extended surface of said substrate conveyer, beneath said coating position, said substrate holder cooperating with a lift, drivingly lifting said substrate holder from said conveyer in a position wherein a substrate on said substrate holder is in said coating position.

23. The vacuum layer deposition apparatus according to claim 1, comprising a handling robot loading a substrate on and unloading a substrate from said substrate holder.

24. The vacuum layer deposition apparatus according to claim 1, wherein said substrate holder, at least in a position in which a substrate thereon is in a coating position is operated on electric ground potential.

25. A method of vacuum-process depositing a layer on a substrate, or of manufacturing such substrates coated with a vacuum-process deposited layer, comprising:

providing a substrate on a first electrode surface within an evacuated vacuum recipient;

generating within said vacuum recipient electrically positively charged particles of a material to be deposited on said substrate;

directionally accelerating said positively charged particles towards the surface of said substrate by generating a Rf plasma between said first electrode surface and a second electrode surface, which second electrode surface being larger than said first electrode surface by a factor of at least 1.5.

26. The method according to claim 25, comprising intermittently enabling and disabling said RF plasma discharge during the deposition process.

27. The method according to claim 25, comprising generating positively charged particles of different materials staggered in time during the deposition process.

28. The method according to claim 25, wherein generating said positively charged particles comprises generating in said vacuum recipient a further plasma.

29. The method according to claim 28, comprising exploiting said second electrode surface as one electrode surface for generating said further plasma.

30. The method according to claim 25, wherein generating said positively charged particles comprises cathode sputtering a solid or liquid target, said cathode sputtering comprising providing a counter electrode with respect to said target, which loops around said substrate.

31. The method according to claim 30, comprising operating said at least one target on the electric potential of said second electrode.

32. The method according to claim 25, wherein generating said positively charged particles comprises magnetron sputtering and electrically supplying said magnetron sputtering by DC or by pulsed DC.

33. The method according to claim 25, wherein generating said positively charged particles comprises performing magnetron sputtering with at least one of a planar magnetron source and of a magnetron source with cylindrical solid material target drivingly rotatable around its axis.

34. The method according to claim 22, comprising providing said substrate on a substrate holder and drivingly moving said substrate holder into and from a position whereat said substrate is in a coating position by a transport mechanism.

35. The method according to claim 30, comprising conveying said substrate by means of a conveyer of a transport mechanism into and out of said vacuum recipient.

* * * * *